United States Patent [19]

Bischer, Jr. et al.

[11] Patent Number: 5,312,647
[45] Date of Patent: May 17, 1994

[54] METHOD AND APPARATUS OF VACUUM DEPOSITION

[75] Inventors: Carmen B. Bischer, Jr., Hayward; Edward A. Small, Jr., Santa Rosa, both of Calif.

[73] Assignee: Dielectric Coating Industries, Hayward, Calif.

[21] Appl. No.: 949,768

[22] Filed: Jul. 24, 1992

[51] Int. Cl.⁵ .............................................. C23C 14/22
[52] U.S. Cl. ................... 427/178; 427/255.5; 427/295; 427/402; 118/50; 118/718; 118/719; 118/725
[58] Field of Search ............... 118/725, 718, 729, 719, 118/733, 50; 427/178, 295

[56] References Cited

U.S. PATENT DOCUMENTS

| | | | |
|---|---|---|---|
| 3,632,406 | 1/1972 | Clough | 118/718 |
| 3,868,271 | 2/1975 | Poley et al. | 134/1 |
| 3,907,607 | 9/1975 | Chu et al. | 118/718 |
| 4,131,691 | 12/1978 | Morley et al. | 204/165 |
| 4,428,809 | 1/1984 | Heimbach et al. | 204/192.29 |
| 4,467,005 | 8/1984 | Pusch et al. | 428/938 |
| 4,953,497 | 9/1990 | Kessler | 118/733 |
| 5,151,303 | 9/1992 | Hales et al. | 118/719 |

Primary Examiner—Anthony McFarlane
Attorney, Agent, or Firm—H. Michael Brucker

[57] ABSTRACT

Improvements in the method and apparatus of vacuum deposition of a highly reflective surface onto aluminum lighting sheet wherein a coil of aluminum is disposed within the vacuum chamber, both as it unwinds and as it rewinds, and the water vapor created by heating the aluminum web from the coil is made available to other vacuum deposition processing compartments within the vacuum chamber including a glow discharge chamber normally fueled by argon gas.

17 Claims, 1 Drawing Sheet

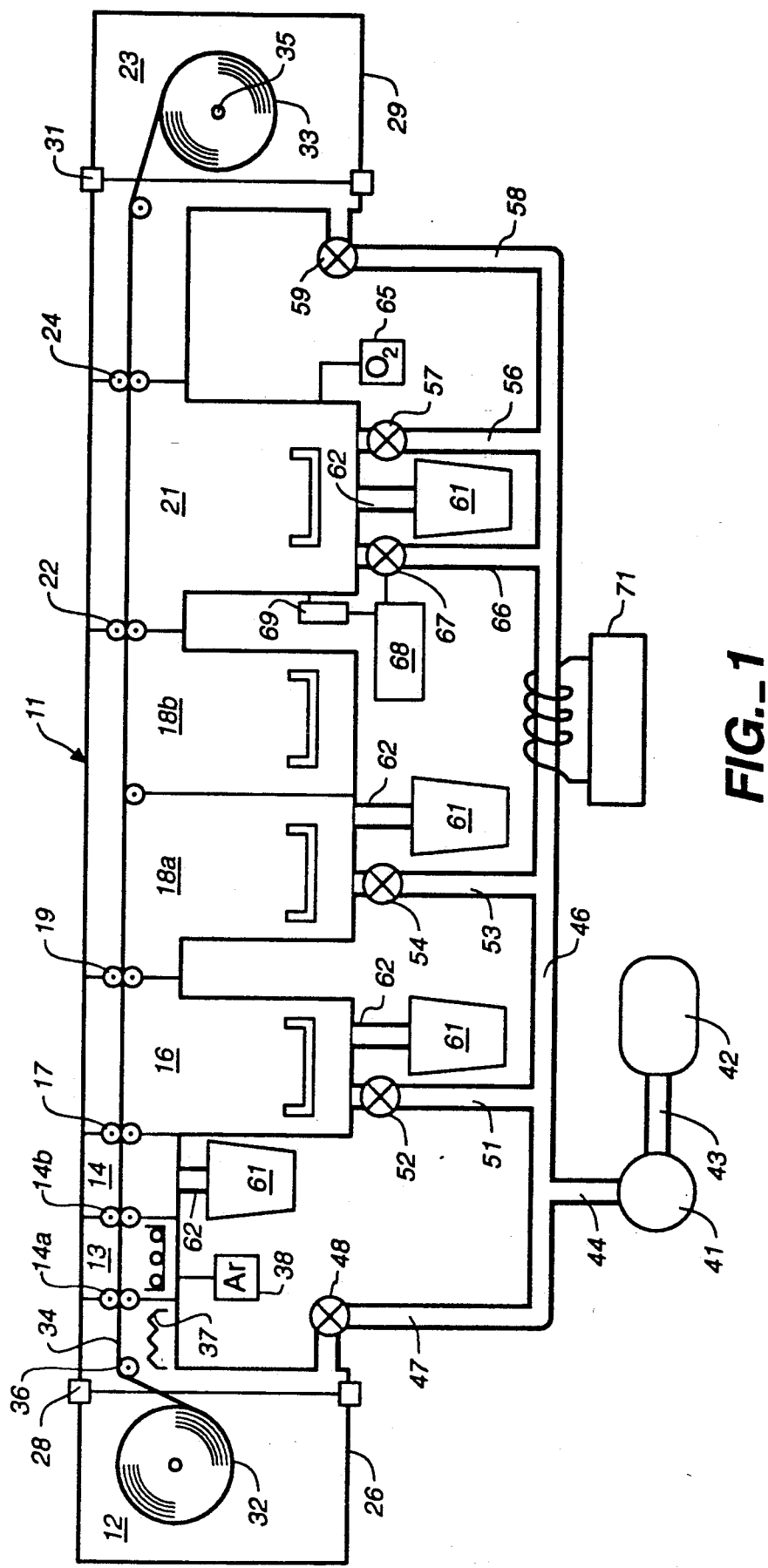
FIG._1

METHOD AND APPARATUS OF VACUUM DEPOSITION

BACKGROUND OF THE INVENTION

The present invention relates to improvements in methods and apparatus for the vacuum deposition of a coating of material onto aluminum webbing, and in particular to the deposition of such a coating onto a moving web as the web moves from an unwinding coil to a winding coil. The invention is particularly suited, and will be described with reference to, the deposition of a high reflective surface onto an aluminum web.

The basic method for the vacuum deposition of a high reflective surface onto an aluminum web has been practiced for many years and is thus well known in the art. This well known method has been practiced, however, only on webbing in the form of individual sheets of glass or aluminum, typically 40 inches wide, 0.020 inches thick and 50 inches long, weighing approximately four pounds. In the present invention, a coil of aluminum typically 40 inches wide, 0.020 inches thick and from 1000 to 1500 feet long, weighing 900 to 1400 pounds or more is unwound from an unwinding coil onto a winding coil and the high reflective coating is vacuum deposited onto the traveling web in stages as the web travels between the unwinding coil to the winding coil.

The method of the present invention, like that of the prior art, is effective to transform a web of polished anodized aluminum (called lighting sheet) having a reflectivity of about 85% into lighting sheet having a reflectivity of about 95%. This increase in reflectivity can be significant when, for example, the sheet is used for reflectors for increasing the light output from lighting fixtures.

The basic, known method includes the following steps. A sheet of aluminum is inserted into a vacuum chamber which is subdivided into series of internal vacuum compartments which are separated by seals that permit each compartments to be at the particular pressure suitable for the process being performed within that compartment. The aluminum sheet is transported from one compartment to another to permit whatever process is being performed in that compartment to be applied to the sheet.

In the first compartment the aluminum sheet is exposed to heat to drive out water. In the next compartment the sheet is exposed to a glow discharge, typically maintained by argon gas, to drive out any remaining water and for further heating to facilitate adhesion. Next the sheet is placed into a compartment where a thin oxide layer is applied to increase adhesion and seal the anodized (aluminum dioxide) layer which covers the polished aluminum sheet stock.

In the next compartment, an opaque layer of aluminum is deposited onto the web. In the following compartments the classical reflectance-enhancing layers of a quarter wave length of low index of refraction material then a quarter wave length of a high index of refraction material are deposited. The high index of refraction material is of the kind deposited in an atmosphere of a partial pressure of oxygen and a partial pressure of water vapor. Each coating is applied in a vacuum compartment to which the sheet is transported after the preceding coating has been applied.

The present invention improves the method and apparatus for applying a high reflectance coating to an aluminum web by using a continuously moving web from a coil of aluminum, by using the water vapor created by heating the web to fuel the glow discharge, and by using the water vapor created by heating the web to stabilize the pressure and background atmosphere in the compartment where the high index layer is applied.

BRIEF DESCRIPTION OF THE INVENTION

The improvements of the present invention are to the methods and apparatus described above for vacuum deposition of coatings onto aluminum and in particular to high reflective coatings onto aluminum lighting sheet.

In the present invention, a coil of lighting sheet (which can be of the typical dimensions mentioned above) is mounted within a vacuum chamber in is own separate low pressure compartment and unwound onto a take-up coil also in its own separate low pressure compartment within the vacuum chamber. Between the unwinding coil compartment and the winding coil compartment are several compartments where the deposition process described above takes place. Thus, unlike the prior art, where separate sheets of material are transported to the various compartments within the chamber to be processed, in the present invention a web of aluminum is continuously moving through the process compartments as it is transported from the unwinding coil to the winding coil. The web moves comfortably at the rate of about five feet per minute with higher speeds possible.

Because the present invention contemplates the deposition of a multiple coat finish onto a long web of substrate, the process necessarily continues over a considerable length of time. In order to achieve a consistent output without having to stop the web and make adjustments (and thereby reduce productivity), stability of the various processes taking place within the chamber 11 becomes a serious consideration.

The aluminum web coming off of the coil in the low pressure unwinding compartment is heated to drive off water. This heating of the web creates a continuous supply of water vapor within the unwinding compartment. This water vapor is then used to fuel the glow discharge in the glow discharge compartment. The water vapor in the unwinding coil compartment is also used to stabilize the required pressure and background atmosphere in the high index deposition compartment.

It is an object of the present invention to provide improvements in vacuum deposition equipment whereby the deposition process can be applied to a continuously moving web of aluminum as it travels from an unwinding coil to a winding coil.

It is another object of the present invention to provide improvements in vacuum deposition equipment whereby a coil of aluminum is disposed in a low pressure compartment where water in the coil is heated into water vapor which is made available to the glow discharge compartment to feed the glow discharge.

It is a further object of the present invention to provide improvements in vacuum deposition equipment whereby a coil of aluminum is disposed in a low pressure compartment where water in the coil is heated into water vapor which is made available to the high index deposition compartment.

Another object of the present invention is to provide improvements in vacuum deposition methods whereby the deposition process can be applied to a continuously moving web of aluminum.

It is yet another object of the present invention to provide improvements in vacuum deposition methods including disposing a coil of aluminum in a low pressure compartment and unwinding the coil onto a take-up coil in a separate low pressure compartment.

Still another object of the present invention is to provide improvements in vacuum deposition methods including disposing a coil of aluminum in a low pressure compartment and driving the water from the coil in the form of water vapor which is made available to a glow discharge compartment.

An additional object of the present invention is to provide improvements in vacuum deposition methods including disposing a coil of aluminum in a low pressure compartment and driving the water from the coil in the form of water vapor which is made available to a high index deposition compartment to maintain stability.

Other objects of the present invention will in part be obvious and will in part appear hereafter.

BRIEF DESCRIPTION OF THE DRAWINGS

FIG. 1 is a schematic diagram of vacuum deposition equipment in which the improvements of the present invention reside.

DESCRIPTION OF PREFERRED EMBODIMENT

Referring to FIG. 1, a vacuum chamber 11 is subdivided into a number of low pressure vacuum compartments where the vacuum deposition process takes place. An unwinding compartment 12 is separated from a glow discharge compartment 13 by a rolling seal 14a. Glow discharge compartment 13 is separated from a pressure differential compartment 14 by a rolling seal 14b, while the pressure differential compartment is separated from an adhesion deposition compartment 16 by rolling seal 17. A compartment 18 is subdivided into sections 18a and 18b for the application of an aluminum layer and a low index layer and is separated from the adhesion compartment by rolling seals 19, while compartment 18 is separated from a high index deposition compartment 21 by rolling seals 22. Finally, a winding compartment 23 is separated from the high index compartment by rolling seals 24.

The rolling seals 14a, 14b, 17, 19, 22, and 24, are all of a type well known in the art for maintaining pressure separation between adjacent vacuum compartments even while allowing material to pass between them. Thus, the construction of the seals does not form any part of the invention per se. It is however, a characteristic of these seals that in being required to continuously pass a moving web they necessarily permit some leakage. The operation of vacuum pumps, as more fully described below, keeps each compartment at its required pressure even though there is some migration across the seals.

Compartment 12 is formed at one end 26 of the vacuum chamber 11 and can be opened at pressure seal 28. Compartment 23 is formed at the other end 29 of vacuum chamber 11 and can be opened at pressure seal 31. In this way, compartment 12 can be opened to receive and hold a coil of aluminum 32 in vacuum chamber 11 for deposition of a coating of high reflective material. And compartment 23 can be opened to permit a coil 33 of finished material to be removed from the chamber 11.

The apparatus performs the deposition process as follows. A coil 32 of polished aluminum (lighting sheet) is loaded into compartment 12 and the web 34 fed through the various rolling seals to take-up coil 33. The take-up coil is mounted on a spindle 35 that is driven clockwise by an appropriate power train (not shown) to coil the processed web and provide a drive for unwinding the web from coil 32 and transporting it through the various process compartments. The chamber 11 is sealed closed and pumped to a low pressure by well known means such as a rotary pump 41 and a mechanical pump 42 which are connected in series through pressure line 43. The pumps 41 and 42 are connected through a feed line 44 to a main pump line 46 which connects to the individual compartments within chamber 11, except for the glow discharge compartment 13 and pressure differential compartment 14. Pump line 46 connects to the unwinding compartment 12 through line 47 and valve 48; to the adhesion compartment 16 through line 51 and valve 52; to the aluminum and low index compartment 18 through line 53 and valve 54; to the high index compartment 21 through line 56 and valve 57; and, to the winding compartment 23 through line 58 and valve 59.

After the pumps 41 and 42 lower the pressure in the compartments within their range of capability, the valves 48, 52, 54, 57 and 59 are closed and compartments 14, 16, 18 and 21 are pumped to yet a lower pressure by cryogenic pumps 61 operatively associated with each of those compartments through lines 62.

The various pressures required to be maintained in each compartment is well known in the art and readily achievable with well known apparatus. By way of example only, the working pressure in the unwinding compartment 12 and the winding compartment 23 may be 40 microns while that in the glow discharge compartment 13 is 20 to 30 microns. The pressure in the glow discharge compartment is established without pumping that compartment directly. Rather the pressure in compartment 13 is set by establishing a pressure in compartment 14 that is higher than the pressure in compartment 16 (but lower than the pressure in compartment 12) in an amount that sets up a pressure gradient across seals 14a and 14b that establishes the requisite pressure in compartment 13. Because compartment 16 is maintained at a very low pressure, differential pressure chamber 14 is formed by two seals 14b and 17 and pumped by its associated pump 61 to a pressure that establishes the correct gradient between seals 14a and 14b to set the pressure in compartment 13 at the required level.

The adhesion compartment 16 is pumped to $10^{-4}$ torr, the aluminum and low index compartment 18 is pumped to $2 \times 10^{-5}$ torr, and the high index compartment 21 is pumped to $6 \times 10^{-5}$ torr.

As the aluminum web 34 is transported from coil 32 in unwinding compartment 12 to coil 33 in winding compartment 33 it passes through, and is guided by, the various rolling seals that separate the various internal compartments within chamber 11. In these compartments the moving web is subjected to the process taking place in that compartment, eventually leading to a web with a high reflective coating.

As the web leaves the coil 32 it is fed over a guide roller 36 and into rolling seals 14a and 14b. Within compartment 12 and between the coil 32 and the seal 14a the web 34 is heated by a heater 37 to drive out water carried in the aluminum, creating water vapor within compartment 12. Because the pressure in unwinding compartment 12 is higher than the pressure in glow chamber 13, the water vapor migrates across the seal 14a into compartment 13 where it is used to maintain the glow discharge initiated by the introduction of argon gas from a gas supply source 38. Under some circumstances the argon gas can be discontinued altogether as the combination of the water vapor from chamber 12 and the additional water vapor created by the glow discharge bombardment of the web, will maintain the glow by itself. In any event, the availability of water vapor in compartment 13 reduces the amount of argon gas required to maintain the glow thereby reducing the cost of operating the glow discharge.

The water vapor in compartment 12 can also be used in high index compartment 21 to stabilize the required pressure and background atmosphere therein to properly carry out the deposition of high index material over a significant period of time.

The high index deposition process starts out in an atmosphere of oxygen and water vapor. As the process progresses, oxygen is consumed and resupplied at a constant rate from oxygen supply 65. The initial water vapor is also consumed in the process with an attendant drop in pressure in compartment 21. In prior art methods and apparatus where the duration of the process is relatively short, this loss of water vapor is compensated for by increasing the flow of oxygen into the compartment. For long duration processes, however, as contemplated by the present invention, oxygen alone cannot adequately stabilize the process.

Thus, in the present invention, water vapor is made available to compartment 21 to augment the water vapor taken from the walls of the compartment in the deposition process. A convenient source of that water vapor is compartment 12. A feed line 66 off of main pump line 46 connects through a valve 67 to compartment 21. By opening valve 48 at compartment 12, water vapor from that compartment is available to compartment 21 whenever valve 67 is open. A valve control means 68 receives a signal from pressure sensor 69 which senses the pressure in compartment 21. The control means (which can be any one of several well know devices for controlling valve operation) is adjusted to have a set point pressure at which it opens valve 67 and a set point at which it closes the valve. When the pressure in compartment 21 varies from the set point pressure by a pre-set amount, that condition is sensed by sensor 69 and control means 68 causes valve 67 to open to permit water vapor into the chamber to re-establish the required pressure and resupply water vapor leached form the walls of the compartment in the deposition process. When the desired conditions have been re-established, sensor 69 sends a signal to control means 68 and the valve 67 closes cutting off the flow of water vapor.

A heater 71 is operatively associated with the main pressure line 46 to keep the water vapor in line 46 from condensing as it travels from compartment 12 to compartment 21.

The interjection of water vapor into glow discharge chamber 13 is facilitated in the preferred embodiment across the rolling seal 14a by the force of an established pressure gradient. The same result can be achieved by the use of an arrangement of parts substantially identical to that described with reference to the interjection of water vapor into compartment 21. In that case a separate line from compartment 11 to compartment 13 through appropriate valving would permit the metering of water vapor to compartment 13 as needed to sustain the glow discharge therein.

The invention having been fully described, it is not to be limited to the details herein set forth, but is of the full scope of the appended claims.

We claim:

1. In apparatus for applying a coating of high light reflecting material to a continuously moving long web of aluminum from a coil, including coating means, and a vacuum chamber in which the coating takes place, the improvement comprising:
   a first vacuum compartment within the chamber wherein said vacuum compartment contains the coil of aluminum to which the high reflective coating is to be applied; and
   heater means in said vacuum compartment for driving off water from the coil and creating water vapor in said compartment.

2. The apparatus of claim 1 further comprising:
   a second vacuum compartment within the chamber;
   feed means operable to unwind the coil of aluminum and direct the web out of said first compartment through said second compartment; and
   vapor transport means for interjecting water vapor from said first compartment into said second compartment.

3. The apparatus of claim 2 further comprising:
   seal means, through which the web passes from said first compartment to said second vacuum compartment and through which the water vapor from said first compartment passes.

4. The apparatus of claim 3 wherein said seal means is a rolling seal.

5. The apparatus of claim 3 further comprising:
   vacuum pump means for reducing the pressure in said first and second compartments with the pressure in said first compartment being maintained higher than the pressure in said second compartment.

6. The apparatus of claim 2 wherein:
   said vapor transport means establishes a pressure differential between said first and second compartments creating a pressure gradient by which water vapor is driven into said second compartment.

7. The apparatus of claim 2 wherein:
   said second compartment contains a glow discharge for treating the web therein and the water vapor transported from said first compartment to said second compartment contributes to maintaining the glow discharge in said second compartment.

8. The apparatus of claim 2 further wherein:
   said second compartment is a coating deposition compartment and the water vapor transported from said first compartment to said second compartment contributes to maintaining a relatively constant pressure and water vapor content within said second chamber.

9. The apparatus of claim 2 further comprising:
   a third vacuum compartment separate from said second vacuum compartment through which the web is continuously moved and in which material is deposited onto the web and which compartment is connected to said first vacuum compartment through pressure sensitive valve means whereby under specified pressure conditions in said third vacuum compartment water vapor from said first vacuum compartment is admitted to said third vacuum compartment.

10. In a machine for application of a high light reflecting coating to a long web of aluminum that has been wound into a coil, the improvement comprising:

a first vacuum compartment for containing the coil of aluminum;

a second vacuum compartment for deposition of a coating onto the web;

feed means operable to unwind the coil of aluminum and direct the web out of said first compartment through said second compartment;

water vapor source means; and water vapor transport means for interjecting water vapor into said second compartment.

11. The machine of claim 10 wherein:

said water vapor source means comprises heater means in said first compartment for driving off water from the web and creating water vapor.

12. The machine of claim 11 wherein:

said water vapor transport means includes a pressure sensitive valve means operatively disposed between said first compartment and said second compartment whereby under specified pressure conditions in said second vacuum compartment water vapor from said first vacuum compartment is admitted to said second vacuum compartment.

13. The machine of claim 12 wherein:

said vapor transport means further includes heater means for maintaining the water vapor from said first compartment in vapor state while being transported form said first compartment to said second compartment.

14. In a method for vacuum deposition of a high reflective coating onto a web of aluminum wherein the aluminum is in the form of a long web wound into a coil, the improvement comprising:

disposing the coil of aluminum in a first vacuum compartment;

heating the aluminum web in the first compartment to drive off water and form water vapor.

15. The method of claim 14 further comprising the steps of:

passing the web into a second vacuum compartment; and interjecting water vapor from the first compartment into the second compartment.

16. The method of claim 15 further comprising the steps of:

creating a plasma glow in the second compartment; and using the water vapor interjected into the second compartment for maintaining the plasma glow.

17. The method of claim 14 further comprising the steps of:

establishing a set point pressure for the second compartment;

interjecting water vapor into the second compartment when the pressure in the second compartment deviates from the set point pressure by a predetermined amount.

* * * * *

UNITED STATES PATENT AND TRADEMARK OFFICE
CERTIFICATE OF CORRECTION

PATENT NO. : 5,312,647
DATED : May 17, 1994
INVENTOR(S) : Carmen B. Bischer, Jr.
Edward A. Small It is certified that error appears in the above-indentified patent and that said Letters Patent is hereby corrected as shown below:

On the title page, the application number is corrected to read:

"919,768"

Signed and Sealed this

Sixth Day of September, 1994

Attest:

BRUCE LEHMAN

Attesting Officer     Commissioner of Patents and Trademarks